(12) United States Patent
Hashizume et al.

(10) Patent No.: US 9,293,352 B2
(45) Date of Patent: Mar. 22, 2016

(54) SUBSTRATE PROCESSING METHOD

(75) Inventors: Akio Hashizume, Kyoto (JP); Yuya Akanishi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 34 days.

(21) Appl. No.: 13/590,215

(22) Filed: Aug. 21, 2012

(65) Prior Publication Data

US 2013/0052828 A1 Feb. 28, 2013

(30) Foreign Application Priority Data

Aug. 30, 2011 (JP) ................ P2011-187415

(51) Int. Cl.
*H01L 21/311* (2006.01)
*H01L 21/67* (2006.01)
*H01L 21/02* (2006.01)
*H01L 21/306* (2006.01)

(52) U.S. Cl.
CPC ...... *H01L 21/67028* (2013.01); *H01L 21/0206* (2013.01); *H01L 21/02381* (2013.01); *H01L 21/02488* (2013.01); *H01L 21/02532* (2013.01); *H01L 21/02658* (2013.01); *H01L 21/306* (2013.01)

(58) Field of Classification Search
None
See application file for complete search history.

(56) References Cited

U.S. PATENT DOCUMENTS

| | | | |
|---|---|---|---|
| 6,837,944 B2 * | 1/2005 | Kashkoush et al. | 134/28 |
| 2002/0043691 A1 | 4/2002 | Higashi et al. | 257/368 |
| 2003/0045063 A1 | 3/2003 | Oda | 438/309 |
| 2003/0199126 A1* | 10/2003 | Chu et al. | 438/149 |
| 2004/0212035 A1 | 10/2004 | Yeo et al. | 257/510 |
| 2005/0277272 A1 | 12/2005 | Singh et al. | 438/479 |
| 2006/0216941 A1 | 9/2006 | Hasebe et al. | 438/715 |
| 2007/0077768 A1 | 4/2007 | Fujii et al. | 438/717 |
| 2007/0181057 A1 | 8/2007 | Lam et al. | 117/92 |
| 2008/0078426 A1 | 4/2008 | Miya et al. | 134/30 |

FOREIGN PATENT DOCUMENTS

| | | |
|---|---|---|
| CN | 1157477 A | 8/1997 |
| CN | 1417844 A | 5/2003 |
| CN | 1930662 A | 3/2007 |
| EP | 0 772 230 A1 | 5/1997 |
| EP | 1993128 A2 * | 11/2008 |
| EP | 1978553 A3 * | 6/2010 |
| JP | 2003-77844 | 3/2003 |
| JP | 2005-265459 A | 9/2005 |
| JP | 2006-086411 | 3/2006 |
| JP | 2010-045254 | 2/2010 |

(Continued)

OTHER PUBLICATIONS

Ericsson, Silicon/Germanium Molecular Beam Epitaxy, Apr. 25, 2006, Karlstads Uiversitet, cover and p. 47.*

(Continued)

*Primary Examiner* — Binh X Tran
*Assistant Examiner* — David Cathey, Jr.
(74) *Attorney, Agent, or Firm* — Ostrolenk Faber LLP

(57) ABSTRACT

In a substrate processing apparatus (1), a silicon oxide film on a main surface of a substrate (9) is removed in an oxide film removing part (4) and then a silylation material is applied to the main surface, to thereby perform a silylation process in a silylation part (6). It is thereby possible to lengthen the Q time from the removal of the silicon oxide film to the formation of the silicon germanium film and reduce the temperature for prebaking in the formation of the silicon germanium film.

10 Claims, 12 Drawing Sheets

(56) References Cited

FOREIGN PATENT DOCUMENTS

| | | |
|---|---|---|
| JP | 2011-071169 | 4/2011 |
| KR | 10-2007-0036670 | 4/2007 |
| TW | 200423306 | 11/2004 |
| TW | 200737310 | 10/2007 |
| TW | 200818283 | 4/2008 |

OTHER PUBLICATIONS

Organic Chemistry Portal, Ozone, 2009, Organic Chemistry Portal.*

Patton et al, Silicon-Germanium-Base Heterojunction Bipolar Transistors by molecular beam epitaxy, Apr. 1988, IEEE Electron Device Lettes, vol. 9, No. 4, p. 165-167.*

* cited by examiner

SUBSTRATE PROCESSING METHOD

TECHNICAL FIELD

The present invention relates to a substrate processing method and a substrate processing apparatus both for processing a silicon substrate as a preprocess of a process of forming a silicon germanium film on the silicon substrate.

BACKGROUND ART

In recent years, in forming transistors on a silicon substrate, distortion is caused to occur in a silicon layer serving as a channel part by forming a silicon germanium (SiGe) film in the vicinity of the silicon layer. A transistor having distortion in the silicon layer serving as the channel part allows a high speed operation.

Japanese Patent Application Laid Open Gazette No. 2006-86411 discloses a technique for recovering damages of a low dielectric constant coating film on a substrate, which are caused by dry process, to thereby recover the property of the low dielectric constant coating film. In this technique, a reaction product formed on the substrate is removed in a cleaning unit and a silylation process is performed on the substrate by supplying a silylation material to the substrate in a silylation unit.

As a preprocess of a process of forming a silicon germanium film on a silicon substrate, performed is a process of removing a natural oxide film (i.e., a silicon oxide film) on the silicon substrate. After removing the silicon oxide film, another silicon oxide film is grown on the silicon substrate until the silicon germanium film is formed. For this reason, it is necessary to strictly manage a time period (hereinafter, referred to as a "Q time") from completion of the process of removing the silicon oxide film to start of the process of (pertaining) forming the silicon germanium film. Under the current circumstances, the Q time is, e.g., two to four hours, and such a short Q time may cause a hindrance to an improvement in productivity of semiconductor products. Further, in the process of forming the silicon germanium film, oxygen and the like which are deposited on the silicon substrate are removed by prebaking. Under the current circumstances, the temperature for prebaking needs to be set to, e.g., 800° C. and this affects the electrical property of the semiconductor products.

SUMMARY OF INVENTION

The present invention is intended for a substrate processing method for processing a silicon substrate as a preprocess of a process of forming a silicon germanium film on the silicon substrate, and it is an object of the present invention to lengthen a Q time from removal of a silicon oxide film to formation of a silicon germanium film and reduce the temperature for prebaking in the formation of the silicon germanium film.

The substrate processing method according to the present invention comprises the steps of a) removing a silicon oxide film from a main surface of a silicon substrate, and b) applying a silylation material to the main surface to thereby perform a silylation process thereon. By the present invention, it is possible to lengthen the Q time from removal of the silicon oxide film to formation of the silicon germanium film and reduce the temperature for prebaking in the formation of the silicon germanium film.

According to a preferred embodiment of the present invention, the step a) comprises the steps of a1) applying a removal liquid used for removing the silicon oxide film, onto the main surface, and a2) applying a rinse liquid onto the main surface, and oxygen concentration in at least one of the removal liquid and the rinse liquid is reduced. This makes it possible to further lengthen the Q time and further reduce the temperature for prebaking.

Preferably, a pattern for transistors is formed on the silicon substrate.

The present invention is also intended for a substrate processing apparatus for processing a silicon substrate as a preprocess of a process of forming a silicon germanium film on the silicon substrate.

These and other objects, features, aspects and advantages of the present invention will become more apparent from the following detailed description of the present invention when taken in conjunction with the accompanying drawings.

DESCRIPTION OF EMBODIMENTS

Figure 1:
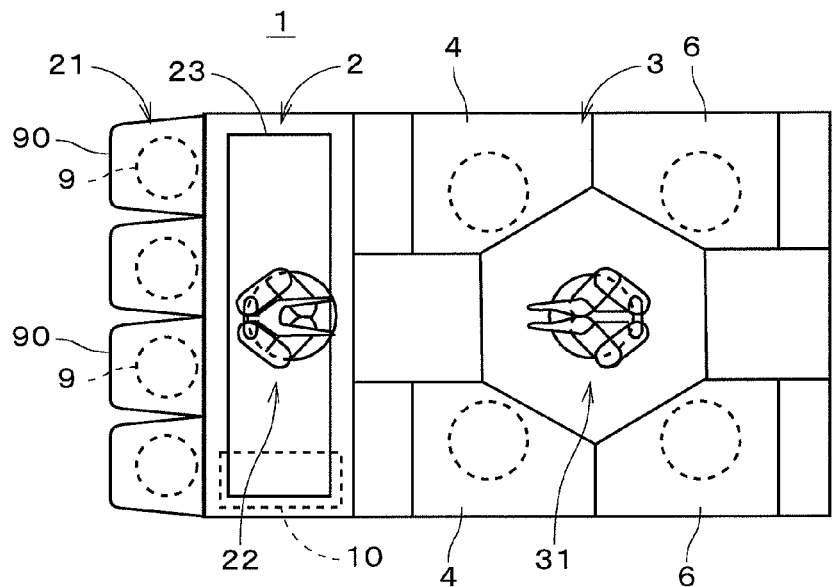
FIG. 1 is a view showing a configuration of a substrate processing apparatus in accordance with a first preferred embodiment of the present invention.

FIG. 1 is a view showing a configuration of a substrate processing apparatus 1 in accordance with the first preferred embodiment of the present invention. The substrate processing apparatus 1 is a sheet-fed apparatus for processing a circular silicon substrate (hereinafter, referred to simply as a "substrate") 9 with a predetermined chemical-liquid, a rinse liquid, and the like. The substrate processing apparatus 1 comprises an indexer block 2, a processing block 3, and a control part 10, and the control part 10 controls constituent elements of the indexer block 2 and the processing block 3.

The indexer block 2 comprises a carrier holding part 21 for holding carriers 90, an indexer robot 22 disposed between the carrier holding part 21 and the processing block 3, and an indexer robot moving mechanism 23 for moving the indexer robot 22 in a longitudinal direction of FIG. 1. In the carrier holding part 21, a plurality of carriers 90 are aligned in the longitudinal direction of FIG. 1 (in other words, in a moving direction of the indexer robot 22). In each of the carriers 90, a plurality of substrates 9 are contained. In the indexer robot 22, the substrate 9 is unloaded from the carrier 90 and loaded into the carrier 90.

The processing block 3 comprises two oxide film removing parts 4, two silylation parts 6, and a center robot 31. The two oxide film removing parts 4 and the two silylation parts 6 are so disposed as to surround the center robot 31 and the center robot 31 transfers the substrate 9 in the processing block 3. As discussed later, the oxide film removing part 4 removes a silicon oxide film ($SiO_2$) from a main surface of the substrate 9 and the silylation part 6 performs a silylation process on the main surface of the substrate 9.

Figure 2:
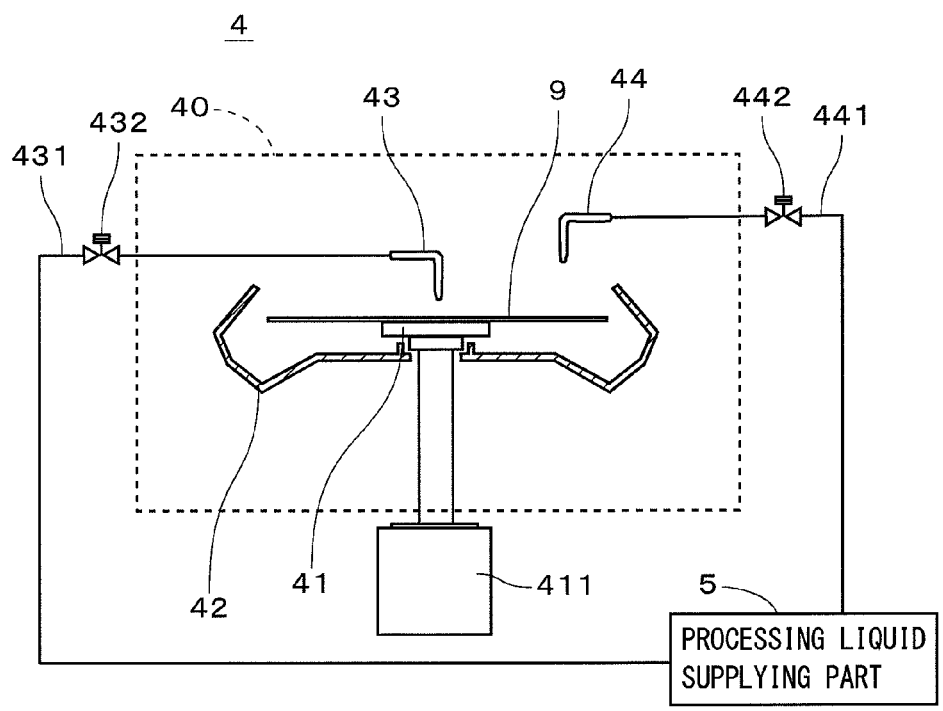
FIG. 2 is a view showing a configuration of an oxide film removing part.

FIG. 2 is a view showing a configuration of the oxide film removing part 4. The oxide film removing part 4 comprises a spin chuck 41 for holding the substrate 9 horizontally, a cup part 42 surrounding the spin chuck 41, a removal liquid nozzle 43 for applying a processing solution (hereinafter, referred to as a "removal liquid") used for removing the silicon oxide film to the substrate 9, and a rinse liquid nozzle 44 for applying a rinse liquid to the substrate 9. The spin chuck 41, the cup part 42, the removal liquid nozzle 43, and the rinse liquid nozzle 44 are provided in a chamber body 40. The spin chuck 41 is rotatable by a spin motor 411 around an axis parallel to a vertical direction.

The removal liquid nozzle 43 is movable by a not-shown moving mechanism between a supply position above the spin chuck 41 and a waiting position outside the cup part 42 (in other words, a position not overlapping the cup part 42 in the vertical direction). Similarly, the rinse liquid nozzle 44 is movable by a not-shown moving mechanism between a supply position above the spin chuck 41 and a waiting position outside the cup part 42. The removal liquid nozzle 43 and the rinse liquid nozzle 44 are connected to a processing liquid supplying part 5.

Figure 3:
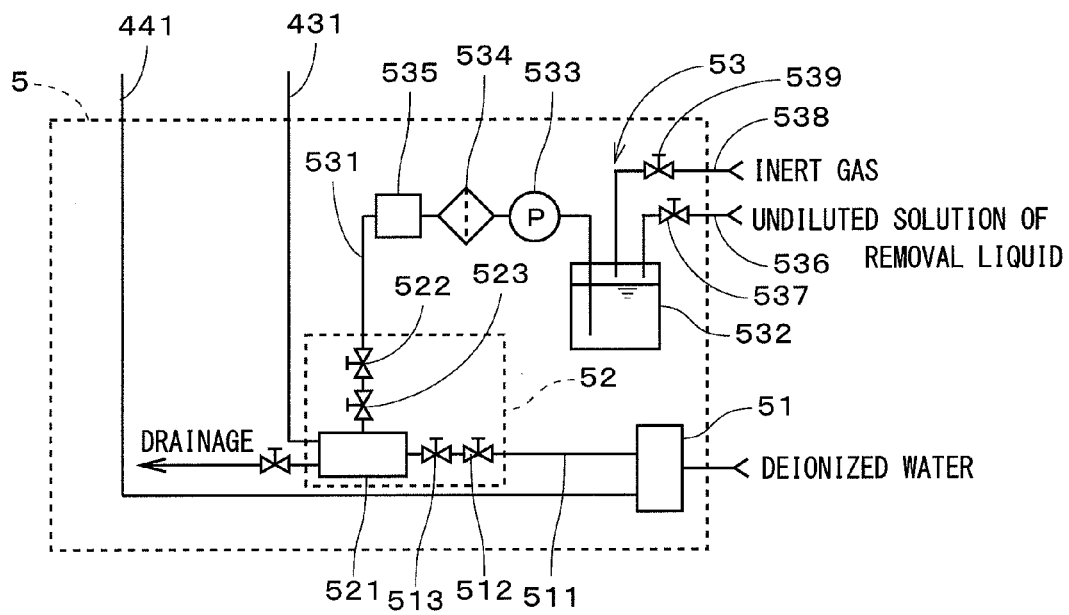
FIG. 3 is a view showing a configuration of a processing liquid supplying part.

FIG. 3 is a view showing a configuration of the processing liquid supplying part 5. The processing liquid supplying part 5 comprises an inert gas dissolved water generation part 51 for degassing oxygen from deionized water and adding an inert gas to the deionized water, to thereby generate inert gas dissolved water. The inert gas dissolved water generation part 51 degasses oxygen until the oxygen concentration in the supplied deionized water becomes, e.g., 20 ppb (parts per billion) and adds nitrogen ($N_2$) gas of high purity (e.g., nitrogen gas having a concentration ranging from 99.999% to 99.999999999%) to the deionized water, to thereby generate inert gas dissolved water of e.g., 7 ppm (parts per million) to 24 ppm.

The processing liquid supplying part 5 comprises a preparation part 52 for preparing a removal liquid by mixing a undiluted solution of the removal liquid with the inert gas dissolved water, and an undiluted solution supplying part 53 for supplying the undiluted solution to the preparation part 52. The undiluted solution supplying part 53 comprises a tank 532 for storing the undiluted solution of the removal liquid therein, and the tank 532 is connected to the preparation part 52 through a supply pipe 531. The tank 532 is a sealed container, and an internal space of the tank 532 is cut off from the outside. The supply pipe 531 is provided with a pump 533, a filter 534, and a degassing part 535 in this order from the side of the tank 532 toward the preparation part 52. The degassing part 535 has the same structure as the inert gas dissolved water generation part 51 but does not add the inert gas.

The tank 532 is connected to a supply pipe 536 and supplied with the undiluted solution of the removal liquid from a not-shown undiluted solution source through the supply pipe 536. The supply pipe 536 is provided with a valve 537 and supplied (replenished) with an unused undiluted solution of the removal liquid when the amount of liquid in the tank 532 becomes less than a predetermined amount. The tank 532 is also connected to a supply pipe 538 provided with a valve 539, and supplied with an inert gas from a not-shown inert gas source through the supply pipe 538. The tank 532 is always supplied with the inert gas as a general rule. This prevents air from flowing into the tank 532. It is thereby possible to suppress or prevent the oxygen from being dissolved in the undiluted solution of the removal liquid stored in the tank 532. Therefore, it is possible to suppress or prevent the amount of dissolved oxygen in the undiluted solution of the removal liquid from increasing.

The undiluted solution of the removal liquid in the tank 532 is drained from the tank 532 by pressure of the inert gas and suction of the pump 533. After the pressure of the undiluted solution is increased by the pump 533, extraneous matters are removed through the filter 534. The undiluted solution of the removal liquid which passed the filter 534 is degassed by the degassing part 535 and the undiluted solution of the removal liquid in which the amount of dissolved oxygen is reduced is supplied to the preparation part 52.

The preparation part 52 is connected to the inert gas dissolved water generation part 51 through a supply pipe 511 and further connected to the undiluted solution supplying part 53 through the supply pipe 531 as discussed earlier. The preparation part 52 comprises a mixing part 521 (manifold) for mixing the undiluted solution of the removal liquid with the inert gas dissolved water thereinside, and the supply pipes 511 and 531 are connected to the mixing part 521. The supply pipe 511 is provided with a valve 512 and a flow regulating valve 513, and the supply pipe 531 is provided with a valve 522 and a flow regulating valve 523. The preparation part 52 controls the amount of undiluted solution of the removal liquid to be supplied and the amount of inert gas dissolved water to be supplied, to thereby generate a removal liquid which is prepared with a predetermined ratio. In the first preferred embodiment, hydrogen fluoride (hydrofluoric acid (HF)) is used as the undiluted solution of the removal liquid and dilute hydrofluoric acid (DHF) is generated as the removal liquid. In the preparation part 52, buffered hydrofluoric acid (BHF) or the like may be generated. The preparation part 52 supplies the removal liquid nozzle 43 (see FIG. 2) with the removal liquid through a supply pipe 431.

Figure 4:
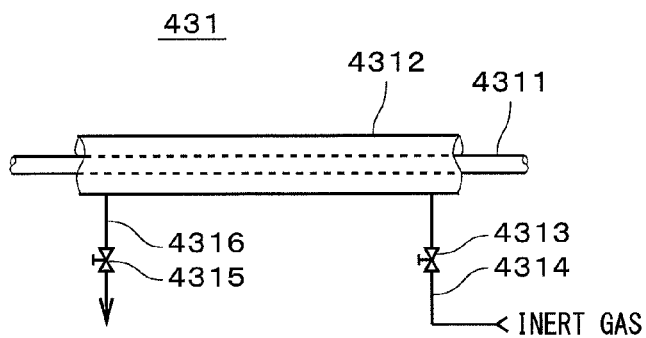
FIG. 4 is a view showing a configuration of a supply pipe.

FIG. 4 is a view showing a configuration of the supply pipe 431. The supply pipe 431 has a double structure and comprises an inner pipe 4311 in which the removal liquid flows and an outer pipe 4312 surrounding the inner pipe 4311. The inner pipe 4311 is supported by a supporting member (not shown) disposed between the inner pipe 4311 and the outer pipe 4312 inside the outer pipe 4312, and this maintains a noncontact state between the inner pipe 4311 and the outer pipe 4312. Between the inner pipe 4311 and the outer pipe 4312, cylindrical space is formed. The inner pipe 4311 and the outer pipe 4312 are each formed of a fluorocarbon resin (e.g., PFA (polytetrafluoroethylene) or the like having excellent chemical liquid resistance and heat resistance. PFA is permeable to oxygen.

The outer pipe 4312 is connected to an auxiliary supply pipe 4314 provided with a valve 4313 and an auxiliary exhaust pipe 4316 provided with a valve 4315. The auxiliary supply pipe 4314 is connected to a not-shown inert gas source, and by opening the valves 4313 and 4315, the inert gas (e.g., nitrogen gas) flows into a space between the inner pipe 4311 and the outer pipe 4312. This exhausts air from the space and replaces the atmosphere in the space with the inert gas atmosphere. In other words, the inner pipe 4311 is enclosed by the inert gas. Also after closing the valves 4313 and 4315, the state in which the inner pipe 4311 is enclosed by the inert gas is maintained and the amount of oxygen flowing into the inner pipe 4311 is reduced. Therefore, it is possible to suppress or prevent the oxygen concentration in the removal liquid from increasing due to the dissolved oxygen in the removal liquid flowing in the inner pipe 4311. In the first preferred embodiment, the oxygen concentration in the removal liquid to be discharged from the removal liquid nozzle 43 is 20 ppb or less (e.g., 5 to 10 ppb).

In the substrate processing apparatus 1, a supply pipe 441 connecting the inert gas dissolved water generation part 51 of FIG. 3 to the rinse liquid nozzle 44 of FIG. 2 has the same structure as the supply pipe 431, and it is possible to suppress or prevent the oxygen concentration in the inert gas dissolved water from increasing due to the dissolved oxygen in the inert gas dissolved water flowing in the supply pipe 441. The supply pipes 431 and 441 may not necessarily have the double structure, but with the above-discussed double structure, it is possible to further suppress or prevent the oxygen concentration in the removal liquid or the inert gas dissolved water flowing in the supply pipes from increasing.

Figure 5:
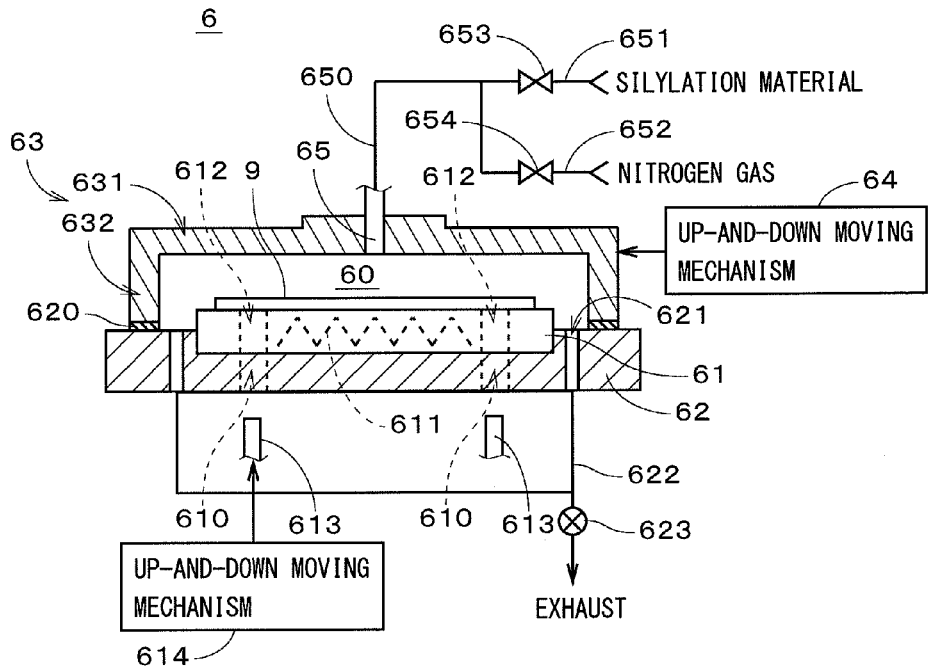
FIG. 5 is a view showing a configuration of a silylation part.

FIG. 5 is a view showing a configuration of the silylation part (silylation processing part) 6. The silylation part 6 has a substrate holding mount 61 for holding the substrate 9 thereon and the substrate holding mount 61 is supported by a supporting member 62. The substrate holding mount 61 is a disk-like mount having a diameter larger than that of the substrate 9, and the substrate 9 can be held horizontally on the substrate holding mount 61. A heater 611 is provided inside the substrate holding mount 61 and the substrate 9 on the substrate holding mount 61 is thereby heated.

The substrate holding mount 61 is provided with a plurality of (herein, three or more) through holes 612 and the supporting member 62 is provided with a plurality of (herein, three or more) through holes 610. Below each of the through holes 612 and 610, provided is a lift pin 613 which is elongated in a vertical direction of FIG. 5. Respective tips of the plurality of lift pins 613 are aligned at the same level in the vertical direction and moved up and down as one unit by an up-and-down moving mechanism 614. Specifically, the plurality of lift pins 613 are disposed either at a position (hereinafter, referred to as a "protruding position") of FIG. 6 where the plurality of lift pins 613 pass inside the plurality of through holes 610 and 612 and the tips thereof protrude from the substrate holding mount 61 or at a position (hereinafter, referred to as an "escape position") of FIG. 5 where the tips thereof come below the plurality of through holes 610 and 612.

Figure 6:
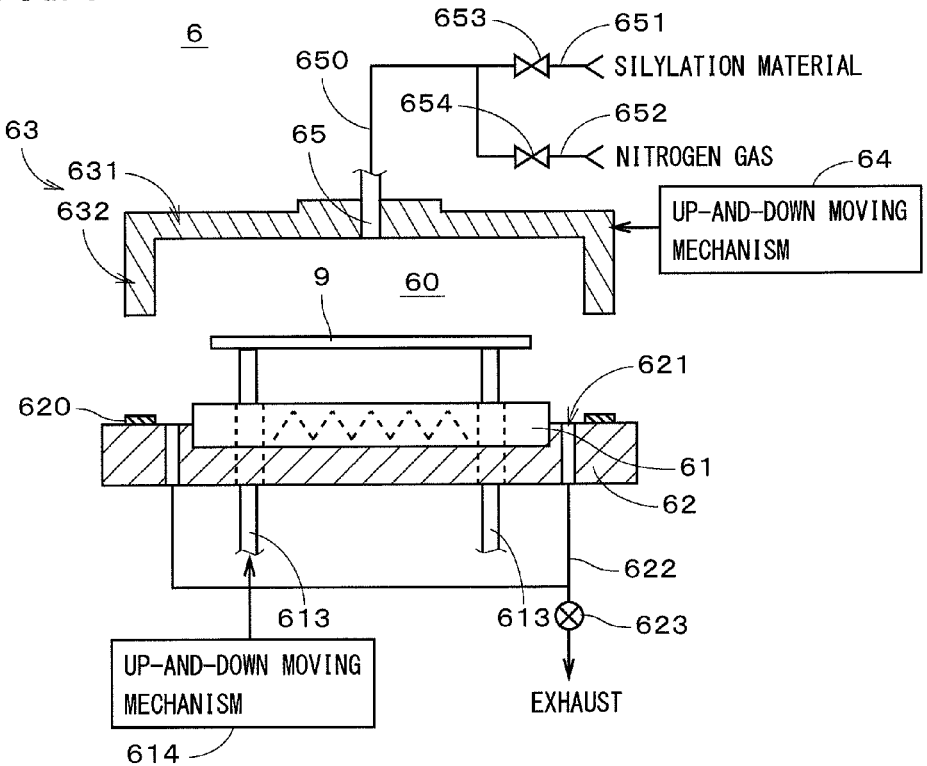
FIG. 6 is a view showing the silylation part whose processing space is open.

As shown in FIG. 6, the substrate 9 is placed on the plurality of lift pins 613 by the center robot 31 with the plurality of lift pins 613 disposed at the protruding position (when a cutoff plate 63 discussed later gets higher), and after that, when the plurality of lift pins 613 move to the escape position, the substrate 9 is placed on the substrate holding mount 61 as shown in FIG. 5. On the other hand, when the plurality of lift pins 613 move from the escape position to the protruding position with the substrate 9 placed on the substrate holding mount 61, the substrate 9 is disposed above the substrate holding mount 61. With this operation, the center robot 31 can unload the substrate 9 from the silylation part 6.

As shown in FIGS. 5 and 6, the silylation part 6 further comprises the cutoff plate 63 disposed above the substrate holding mount 61. The cutoff plate 63 comprises a horizontal disk-like part 631 and a tubular part 632 protruding downward from an outer edge of the disk-like part 631. The disk-like part 631 has a diameter larger than that of the substrate holding mount 61 and an annular end surface of the tubular part 632 is opposed to the supporting member 62. On the supporting member 62, an annular seal member 620 is so provided as to surround the periphery of the substrate holding mount 61. The cutoff plate 63 is moved up and down by the up-and-down moving mechanism 64 and disposed either at the position of FIG. 5 where the end surface of the tubular part 632 comes into contact with the seal member 620 or at the position of FIG. 6 where the end surface of the tubular part 632 is enough away from seal member 620. When the cutoff plate 63 is disposed at the position of FIG. 5, a processing space 60 surrounded by the cutoff plate 63, the substrate holding mount 61, and the supporting member 62 is tightly closed, and when the cutoff plate 63 is moved from the position of FIG. 5 to the position of FIG. 6, the processing space 60 is opened. In the following discussion, the position of the cutoff plate 63 shown in FIG. 5 is termed a "closing position" and the position of the cutoff plate 63 shown in FIG. 6 is termed an "opening position".

At the center of the disk-like part 631 shown in FIG. 5, provided is a jet nozzle 65, which is connected to one end of a supply pipe 650. The other end of the supply pipe 650 is branched into a first bypass 651 and a second bypass 652. The first bypass 651 is connected to a source of a silylation material in a vapor state, and the second bypass 652 is connected to a nitrogen gas source. The first bypass 651 and the second bypass 652 are provided with valves 653 and 654, respectively. When the valve 653 is opened while the valve 654 is closed, the jet nozzle 65 jets a vapor of the silylation material, and when the valve 654 is opened while the valve 653 is closed, the jet nozzle 65 jets the nitrogen gas.

As the silylation material, TMSI (N-trimethylsilylimidazole), BSTFA (N,O-bis(trimethylsilyl)trifluoroacetamide), BSA (N,O-bis(trimethylsilyl)acetamide), MSTFA (N-methyl-N-trimethylsilyl-trifluoroacetamide), TMSDMA (N-trimethylsilyldimethylamine), TMSDEA (N-trimethylsilyldiethylamine), MTMSA (N,O-bis (trimethylsilyl) trifluoroacetamide), TMCS (Trimethylchlorosilane) (with base), HMDS (Hexamethyldisilazane), and the like may be used. In the first preferred embodiment, HMDS is used.

On an upper surface of the supporting member 62, an annular air outlet 621 is so formed as to surround the substrate holding mount 61 in a plan view. The air outlet 621 is connected to an exhaust pipe 622, and the exhaust pipe 622 is provided with a pressure regulating valve 623. As shown in FIG. 5, with the cutoff plate 63 disposed at the closing position, when the jet nozzle 65 jets a gas (a vapor of the silylation material or nitrogen gas), the pressure in the processing space 60 increases. When the pressure in the processing space 60 reaches a predetermined value, the pressure regulating valve 623 is opened and the gas is exhausted from the processing space 60 through the air outlet 621—and exhaust pipe 622. When the pressure in the processing space 60 becomes lower than a predetermined value, the pressure regulating valve 623 is closed and exhaust of the gas is stopped. Thus, the processing space 60 is filled with the gas. After that, the jet nozzle 65 stops jetting the gas, maintaining the state where the processing space 60 is filled with the gas.

Figure 7:
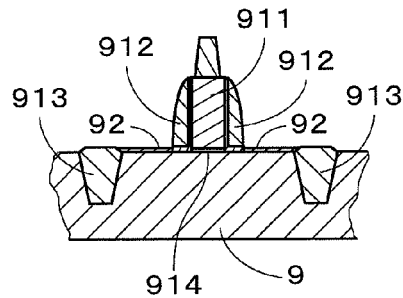
FIG. 7 is a view showing a pattern formed on a substrate.

Herein, discussion will be made on a pattern formed on the substrate 9 to be processed in the substrate processing apparatus 1. FIG. 7 is a view showing a pattern formed on the substrate 9. As shown in FIG. 7, on the substrate 9, formed are gate electrodes 911, spacers 912, STI (Shallow Trench Isolation) parts 913, gate insulating films 914, and the like. In other words, a pattern of multiple transistors being worked on in manufacture, i.e., a pattern for multiple transistors is formed. On a surface of the substrate 9 formed of silicon, there is a silicon oxide film (natural oxide film) 92. Though the silicon oxide film is actually present in entire areas where the main surface of the substrate 9 is exposed, the following discussion will be centered only on an area between a spacer 912 and a STI part 913 (an area to become a source and a drain) and the silicon oxide film 92 is shown in the area (the same applies to the following). An actual silicon oxide film is an extremely thin film.

As discussed later, a silicon germanium film is formed on the substrate 9 having the pattern shown in FIG. 7. The process to be performed on the substrate 9 by the substrate processing apparatus 1 in the following discussion, however, is a preprocess of the process of forming the silicon germanium film, i.e., a process performed immediately before the formation of the silicon germanium film in a flow of process of manufacturing a semiconductor device (the process is not necessarily performed immediately before the formation in terms of time).

Figure 8:
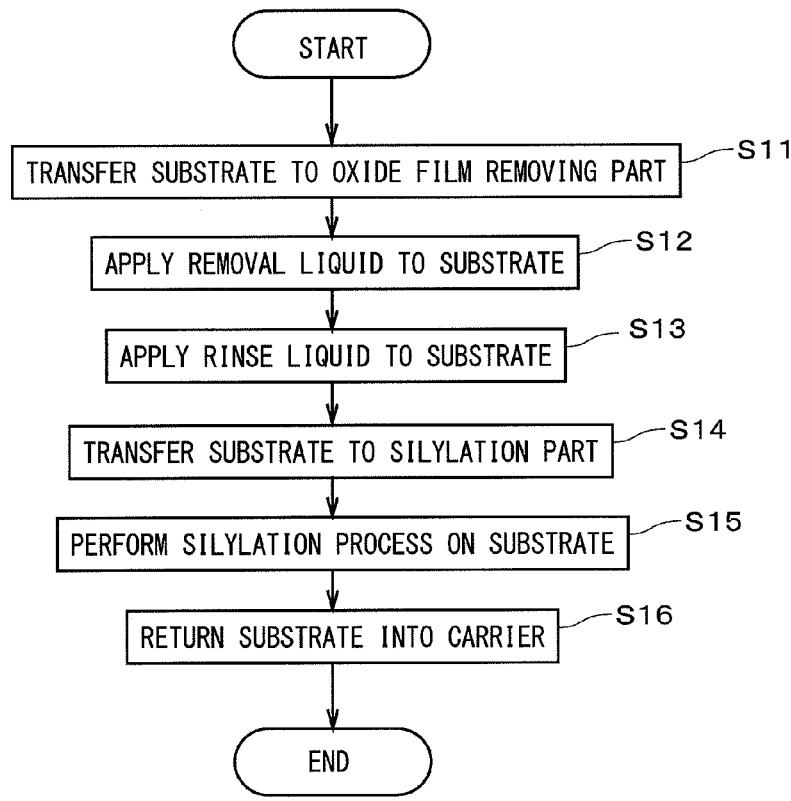
FIG. 8 is a flowchart showing an operation flow for processing the substrate.

FIG. 8 is a flowchart showing an operation flow of the substrate processing apparatus 1 for processing the substrate 9. In the substrate processing apparatus 1 of FIG. 1, a substrate 9 in a carrier 90 is taken out by the indexer robot 22 of the indexer block 2 and passed to the center robot 31 of the processing block 3. Then, the substrate 9 is transferred by the center robot 31 into the oxide film removing part 4 shown in FIG. 2 and held by the spin chuck 41 (Step S11). The chamber body 40 of the oxide film removing part 4 is provided with an exhaust part and a nitrogen gas introduction part which are not shown. By introducing nitrogen gas into the chamber body 40 while exhausting air, the oxygen concentration in the chamber body 40 is controlled to be, e.g., 100 ppm or lower.

In the oxide film removing part 4, the spin chuck 41 starts to be rotated by the spin motor 411 and the removal liquid nozzle 43 is moved to the supply position. Then, the rotation speed of the spin chuck 41 reaches a predetermined speed, the valve 432 of the supply pipe 431 is opened and the removal liquid is thereby applied onto the main surface of the substrate 9 from the removal liquid nozzle 43 (Step S12). At that time, the removal liquid nozzle 43 oscillates in a direction along the main surface of the substrate 9 as necessary (the same applies to application of the rinse liquid from the rinse liquid nozzle 44 discussed later). After the removal liquid is continuously applied for a predetermined time period, the removal liquid nozzle 43 stops the discharge of the removal liquid and is returned to the waiting position.

Figure 9:
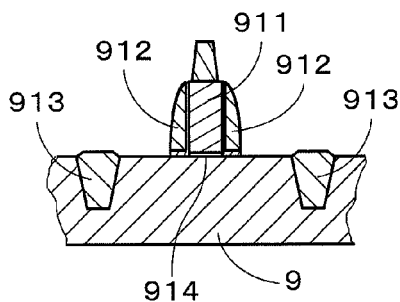
FIGS. 9 and 10 are views each showing a pattern on the substrate.

Subsequently, the rinse liquid nozzle 44 is moved to the supply position. By opening the valve 442 of the supply pipe 441, the rinse liquid (inert gas dissolved water) is applied onto the main surface of the substrate 9 from the rinse liquid nozzle 44 and the removal liquid and the like deposited on the main surface are removed by the rinse liquid (Step S13). After the rinse liquid is continuously applied for a predetermined time period, the rinse liquid nozzle 44 stops the discharge of the rinse liquid and is returned to the waiting position. Further, the rotation speed of the spin chuck 41 increases and the substrate 9 is dried. After the substrate 9 is continuously dried for a predetermined time period, the rotation of the spin chuck 41 is stopped and the substrate 9 is taken out from the oxide film removing part 4 by the center robot 31. With the above-discussed operations of Steps S12 and S13, the silicon oxide film 92 on the substrate 9 (see FIG. 7) is removed as shown in FIG. 9. Further, after the application of the rinse liquid in Step S13 and before the drying of the substrate 9, from a nozzle which is additionally provided in the oxide film removing part 4, a mixed solution (SC1) of ammonia and oxygenated water (hydrogen peroxide) may be applied onto the substrate 9. In this case, after the application of SC1, the rinse liquid is applied again and subsequently the substrate 9 is dried.

In the removal liquid and the rinse liquid in the substrate processing apparatus 1, the oxygen concentration is reduced by the processing liquid supplying part 5 shown in FIG. 3, and on the surface of the substrate 9, there are a lot of Si—F groups and Si—H groups. On the other hand, due to a small amount of oxygen dissolved in the removal liquid and the rinse liquid and the oxygen in the atmosphere, Si—OH group is also present on the surface of the substrate 9.

Subsequently, the center robot 31 transfers the substrate 9 into the silylation part 6 (Step S14). At that time, the cutoff plate 63 is disposed at the opening position as shown in FIG. 6, and the substrate 9 is placed on the plurality of lift pins 613 disposed at the protruding position. Then, after the center robot 31 escapes out of the silylation part 6, the plurality of lift pins 613 are moved to the escape position and the substrate 9 is thereby placed on the substrate holding mount 61. The cutoff plate 63 is moved to the closing position, and then the substrate 9 is disposed in the closed processing space 60 as shown in FIG. 5.

In the silylation part 6, by opening the valve 654, the jet nozzle 65 starts jetting the nitrogen gas and the pressure regulating valve 623 opens/closes in accordance with the pressure inside the processing space 60. The air inside the processing space 60 is thereby replaced with the nitrogen gas and the processing space 60 is filled with the nitrogen gas. After the jet nozzle 65 stops jetting the nitrogen gas, by opening the valve 653, the jet nozzle 65 starts jetting a vapor of the silylation material. Further, the pressure regulating valve 623 opens/closes in accordance with the pressure inside the processing space 60. The nitrogen gas inside the processing space 60 is thereby replaced with the vapor of the silylation material and the processing space 60 is filled with the vapor of the silylation material. By closing the valve 653 when a predetermined time elapses after start of the jet of the vapor of the silylation material, the jet nozzle 65 stops jetting the vapor of the silylation material.

Figure 10:
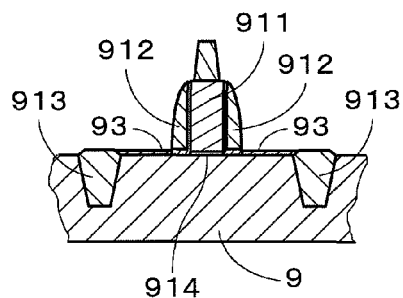

Thus, the environment of the substrate 9 is filled with the vapor of the silylation material and the substrate 9 is held in the atmosphere of the vapor of the silylation material for a predetermined time period. The silylation process is thereby performed on the main surface of the substrate 9 and the main surface is silylated as shown in FIG. 10 (Step S15). FIG. 10 abstractly shows a silylated portion 93 by hatching the vicinity of the main surface of the substrate 9. At that time, since the substrate 9 on the substrate holding mount 61 shown in FIG. 5 is heated by the heater 611 up to a constant temperature higher than the room temperature, the silylation of the main surface is accelerated.

After the substrate 9 is held in the atmosphere of the vapor of the silylation material for a predetermined time period, the jet nozzle 65 starts jetting the nitrogen gas. The vapor of the silylation material and gas caused by the silylation in the processing space 60 are thereby replaced with the nitrogen gas, and the processing space 60 is filled with the nitrogen gas.

When the processing space 60 is filled with the nitrogen gas, the cutoff plate 63 is moved to the opening position to open the processing space 60, and the plurality of lift pins 613 are moved to the protruding position. The substrate 9 on the plurality of lift pins 613 is unloaded from the silylation part 6 by the center robot 31 shown in FIG. 1 and passed to the indexer robot 22 of the indexer block 2. Then, the substrate 9 is returned into the carrier 90 by the indexer robot 22 (Step S16). In an actual case, the above-discussed operations in Steps S11 to S16 are performed on a plurality of substrates 9 partially in parallel.

The substrate 9 which has been processed in the substrate processing apparatus 1 is transferred to another apparatus, to be subjected to a process for forming a silicon germanium film. In the process for forming the silicon germanium film, the substrate 9 is prebaked before actually forming a silicon germanium film thereon. In the first preferred embodiment, the substrate 9 is heated, e.g., at 700° C. for ten to thirty minutes in the prebake process.

Figure 11:
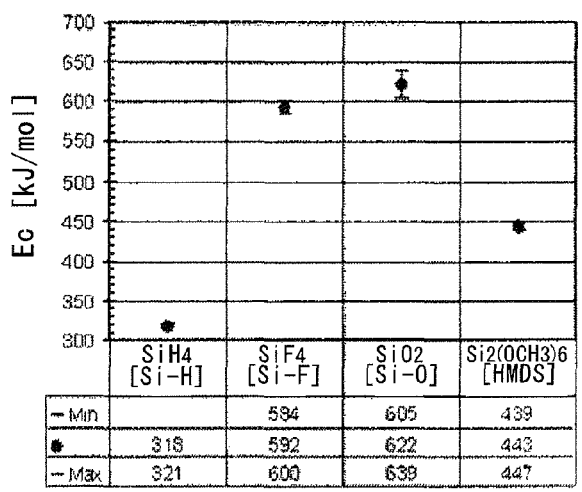
FIG. 11 is a graph showing a chemical bond energy.

Herein, discussion will be made on chemical bond energy of substances on the substrate 9. In the silylation process in the substrate processing apparatus 1, in a case where HMDS is used as the silylation material, on the surface of the substrate 9 which has been silylated, there are a lot of silyl groups due to HMDS. As shown in FIG. 11, since the bond energy of the silyl groups due to HMDS is lower than the bond energy of Si—O in $SiO_2$ and that of Si—F in $SiF_4$, it is possible to remove the silyl groups on the main surface of the substrate 9 with a relatively low temperature in the prebake process.

Figure 12:
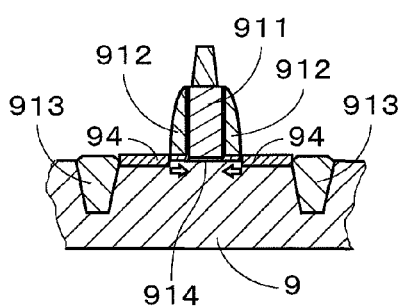
FIG. 12 is a view showing a pattern on the substrate.

After the prebake of the substrate 9 is completed, as shown in FIG. 12, a silicon germanium film 94 is formed on the main surface. By forming the silicon germanium film 94, distortion is caused to occur in a silicon layer serving as a channel part. A transistor having distortion in the silicon layer serving as the channel part allows a high speed operation. The silicon germanium film is formed by, e.g., the thermal CVD method.

Figure 13:
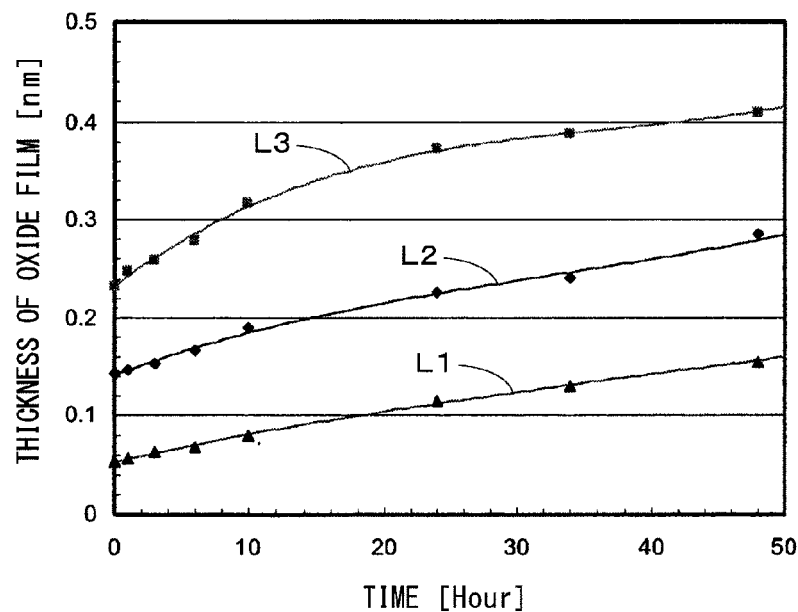
FIG. 13 is a graph showing a change in the thickness of a natural oxide film on the substrate.

FIG. 13 is a graph showing a change (growth) in the thickness of a natural oxide film after removing the silicon oxide film on the substrate 9. The vertical axis represents the thickness of the oxide film and the horizontal axis represents the elapsed time after the removal of the silicon oxide film. In FIG. 13, the line L1 represents the change in the thickness of the oxide film on the substrate which has been subjected to removal of the silicon oxide film with processing solution (the removal liquid and the rinse liquid) in which the oxygen concentration is reduced by the processing liquid supplying part 5 and silylation (hereinafter, referred to as "low oxygen process+silylation process"), the line L2 represents the change in the thickness of the oxide film on the substrate which has been subjected to only removal of the silicon oxide film with a processing solution in which the oxygen concentration is reduced (hereinafter, referred to as "low oxygen process"), and the line L3 represents the change in the thickness of the oxide film on the substrate which has been subjected to only removal of the silicon oxide film with a processing solution in which the oxygen concentration is not reduced (hereinafter, referred to as "normal process"). In the "low oxygen process" and the "normal process", no silylation process is performed.

It can be seen from FIG. 13 that the thickness of the oxide film on the substrate which has been subjected to the "low oxygen process" is smaller than that on the substrate which has been subjected to the "normal process", and the thickness of the oxide film on the substrate which has been subjected to the "silylation process" as well as the "low oxygen process", i.e., subjected to the "low oxygen process+silylation process", is still smaller. On the substrate which has been subjected to the "low oxygen process+silylation process", the thickness of the oxide film after being left for e.g., forty-eight hours is smaller than that on the substrate immediately after the normal process is performed, and therefore the Q time may be set to forty-eight hours.

Figure 14:
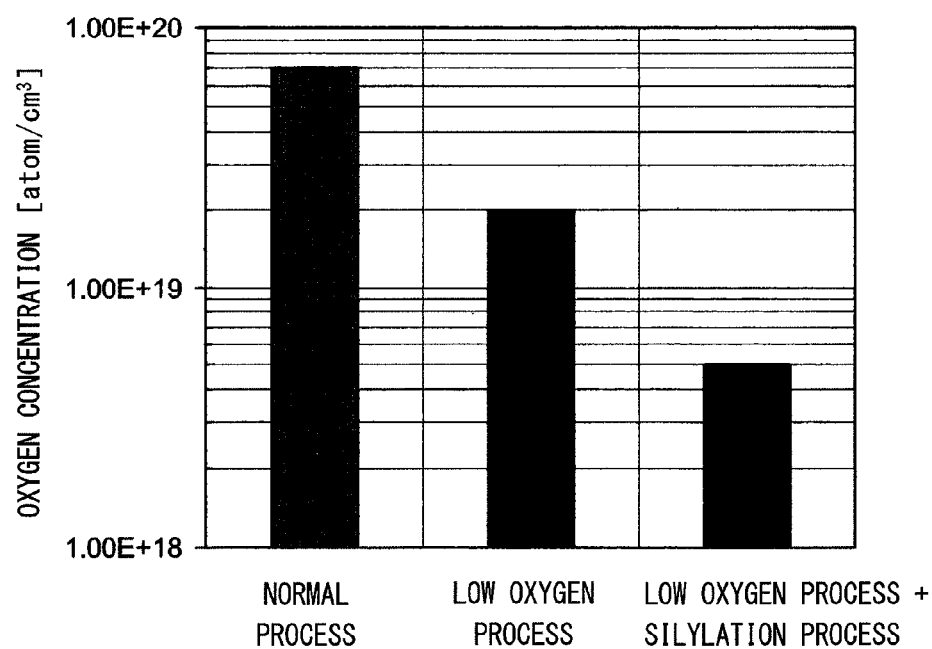
FIG. 14 is a graph showing oxygen concentrations in a silicon germanium film.

FIG. 14 is a graph showing oxygen concentrations in a silicon germanium film formed on the substrate 9. It can be seen from FIG. 14 that the oxygen concentration in the silicon germanium film on the substrate which has been subjected to the "low oxygen process" is lower than that on the substrate which has been subjected to the "normal process", and the oxygen concentration in the silicon germanium film on the substrate which has been subjected to the "low oxygen process +silylation process" is still smaller. Therefore, by the "low oxygen process+silylation process", an appropriate silicon germanium film can be formed.

As discussed above, in the substrate processing apparatus 1 of FIG. 1, after the silicon oxide film on a main surface of the substrate 9 is removed by the oxide film removing part 4, the silylation material is applied by the silylation part 6, to thereby perform the silylation process on the main surface. It is thereby possible to lengthen the Q time from the removal of the silicon oxide film to the formation of the silicon germanium film and reduce the temperature for prebaking in the formation of the silicon germanium film.

In the oxide film removing part 4 of FIG. 2, the removal liquid nozzle 43 serving as a removal liquid applying part applies the removal liquid onto the main surface of the substrate 9 and the rinse liquid nozzle 44 serving as a rinse liquid applying part applies the rinse liquid onto the main surface of the substrate 9. The processing liquid supplying part 5 serving as an oxygen concentration reduction part reduces the oxygen concentration in the removal liquid and the rinse liquid, and it is thereby possible to further lengthen the Q time from the removal of the silicon oxide film to the formation of the silicon germanium film and further reduce the temperature for prebaking in the formation of the silicon germanium film.

Figure 15:
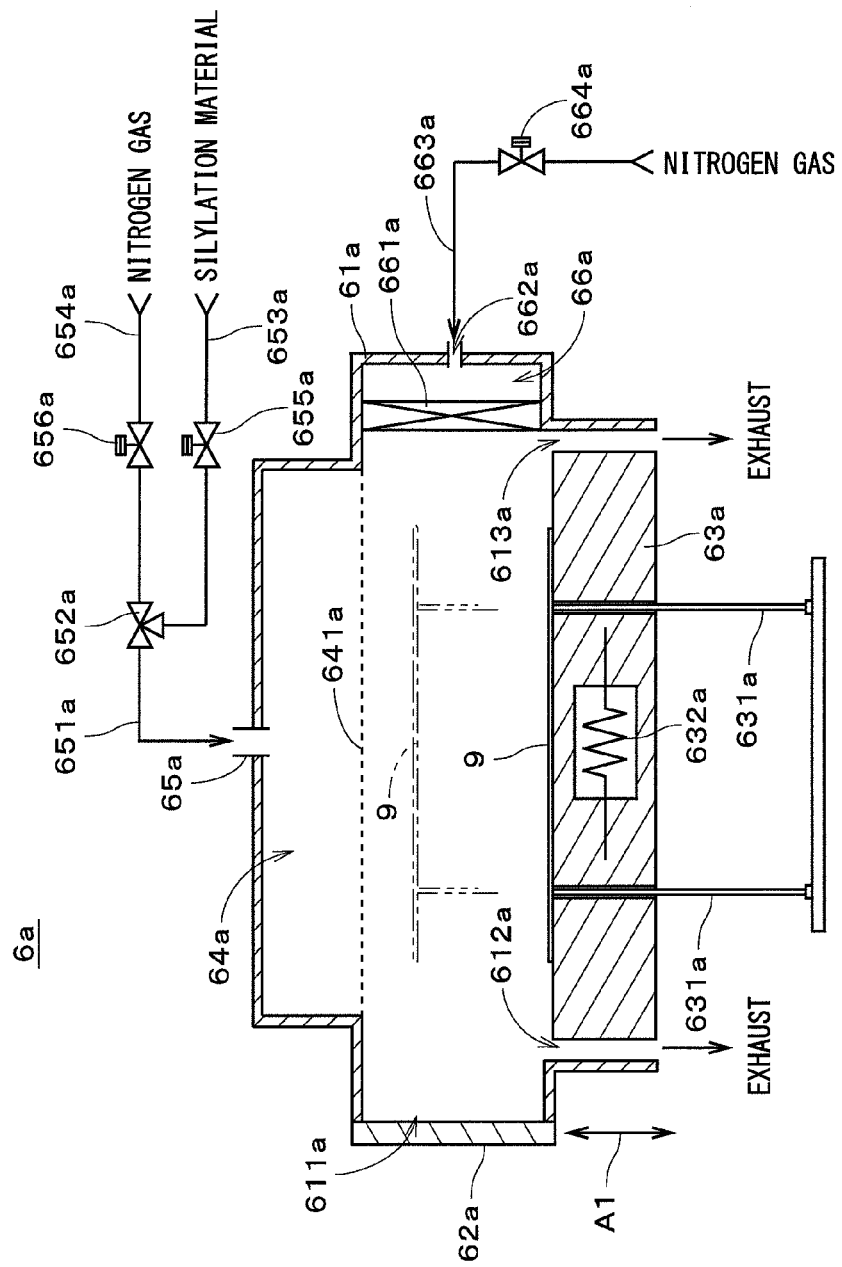
FIG. 15 is a view showing another example of a silylation part.

FIG. 15 is a view showing another example of a silylation part. A silylation part 6a shown in FIG. 15 comprises a chamber body 61a, a shutter 62a for opening/closing a load/unload port 611a which is formed on a side surface of the chamber body 61a, and a mounting plate 63a disposed in a lower portion inside the chamber body 61a. An upper space in the chamber body 61a serves as a supply part 64a for supplying gas to the substrate 9 as discussed later, and inside the chamber body 61a, a space in which the mounting plate 63a is disposed and the supply part 64a are partitioned by a diffusion plate 641a.

A jet nozzle 65a is provided at a portion of the chamber body 61a above the supply part 64a and connected to one end of a supply pipe 651a. The other end of the supply pipe 651a is connected to a first bypass 653a and a second bypass 654a through a three-way valve 652a. The first bypass 653a is connected to a silylation material source and the second bypass 654a is connected to a nitrogen gas source. Supply of the silylation material to the jet nozzle 65a is controlled by a valve 655a and supply of the nitrogen gas is controlled by a valve 656a.

The mounting plate 63a has a plurality of lift pins 631a, like the substrate holding mount 61 shown in FIG. 6. Further, inside the mounting plate 63a, a heater 632a is provided. In FIG. 15, a first exhaust outlet 612a is provided on the left side (on the side of the load/unload port 611a) of the mounting plate 63a and a second exhaust outlet 613a is provided on the right side thereof. The first exhaust outlet 612a and the second exhaust outlet 613a are connected to a not-shown exhaust pump.

An auxiliary supply part 66a is provided at a portion opposed to the load/unload port 611a in the chamber body 61a. Inside the chamber body 61a, a space in which the mounting plate 63a is disposed and the auxiliary supply part 66a are partitioned by a filter 661a. The auxiliary supply part 66a is provided with a supply port 662a and the supply port 662a is connected to one end of a supply pipe 663a. The supply pipe 663a is provided with a valve 664a and the other end of the supply pipe 663a is connected to the nitrogen gas source.

When the silylation process is performed in the silylation part 6a, by moving the shutter 62a in a direction indicated by the arrow Al in FIG. 15, the load/unload port 611a of the chamber body 61a is opened. At that time, by exhausting gas from the first exhaust outlet 612a while opening the valve 664a, it is possible to prevent outside air from flowing into the chamber body 61a from the opened load/unload port 611a. Subsequently, like the silylation part 6 shown in FIG. 6, the substrate 9 is placed on the plurality of lift pins 631a protruding upward from the mounting plate 63a by the center robot 31. After the center robot 31 escapes out of the chamber body 61a, by moving the shutter 62a, the load/unload port 611a is closed. Then, by moving the lift pins 631a down, the substrate 9 is placed on the mounting plate 63a.

Subsequently, the valve 664a is closed and the three-way valve 652 is switched to the side of the valve 656a, and then the valve 656a is opened. Further, gas is exhausted from the first exhaust outlet 612a and the second exhaust outlet 613a. The inside of the chamber body 61a is thereby purged with the nitrogen gas and decompressed to a pressure (e.g., 20 kPa (kilopascal)) lower than the atmosphere pressure. After that, the valve 656a is closed and the three-way valve 652a is switched to the side of the valve 655a, and then the valve 655a is opened. The jet nozzle 65a thereby jets the silylation material and the silylation material is supplied to the substrate 9 from the supply part 64a. At that time, the amount of gas to be exhausted from the first exhaust outlet 612a and the second exhaust outlet 613a is made lower. Preferably, the substrate 9 is heated by the heater 632a incorporated in the mounting plate 63a. The heated temperature is, e.g., about 100 to 120° C.

After the above state is maintained for a predetermined time period, the plurality of lift pins 631a are moved up and the substrate 9 is thereby disposed above the mounting plate 63a. Further, the valve 655a is closed and the three-way valve 652a is switched to the side of the valve 656a, and then the valve 656a is opened, to thereby supply the nitrogen gas to the substrate 9.

Subsequently, the state where the amount of gas to be exhausted from the first exhaust outlet 612a and the second exhaust outlet 613a is made higher and the pressure inside the chamber body 61a is made lower is maintained for a certain time period. After that, the amount of gas to be exhausted from the first exhaust outlet 612a and the second exhaust outlet 613a is made lower and the pressure inside the chamber body 61a is returned to the atmosphere pressure. Then, the load/unload port 611a of the chamber body 61a is opened and the substrate 9 is taken out of the silylation part 6a by the center robot 31.

Thus, also in the silylation part 6a of FIG. 15, like in the silylation part 6 of FIG. 5, the silylation process is performed on the substrate 9 immediately after the silicon oxide film on the main surface of the substrate 9 is removed by the oxide film removing part 4. It is thereby possible to lengthen the Q time until the formation of the silicon germanium film and reduce the temperature for prebaking in the formation of the silicon germanium film.

Figure 16:
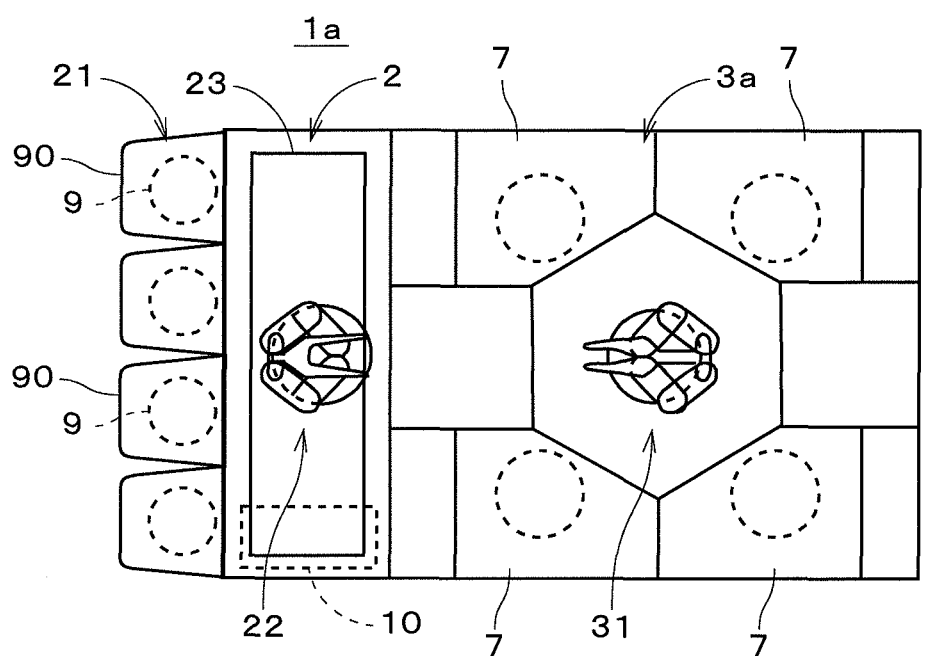
FIG. 16 is a view showing a configuration of a substrate processing apparatus in accordance with a second preferred embodiment of the present invention.

FIG. 16 is a view showing a configuration of a substrate processing apparatus 1a in accordance with the second preferred embodiment of the present invention. The substrate processing apparatus 1a of FIG. 16 is different from the substrate processing apparatus 1 of FIG. 1 in the constitution of a processing block 3a. Other constituent elements are identical to those of FIG. 1 and represented by the same reference signs. In the processing block 3a of FIG. 16, provided are four processing units 7 and the four processing units 7 have the same constitution.

Figure 17:
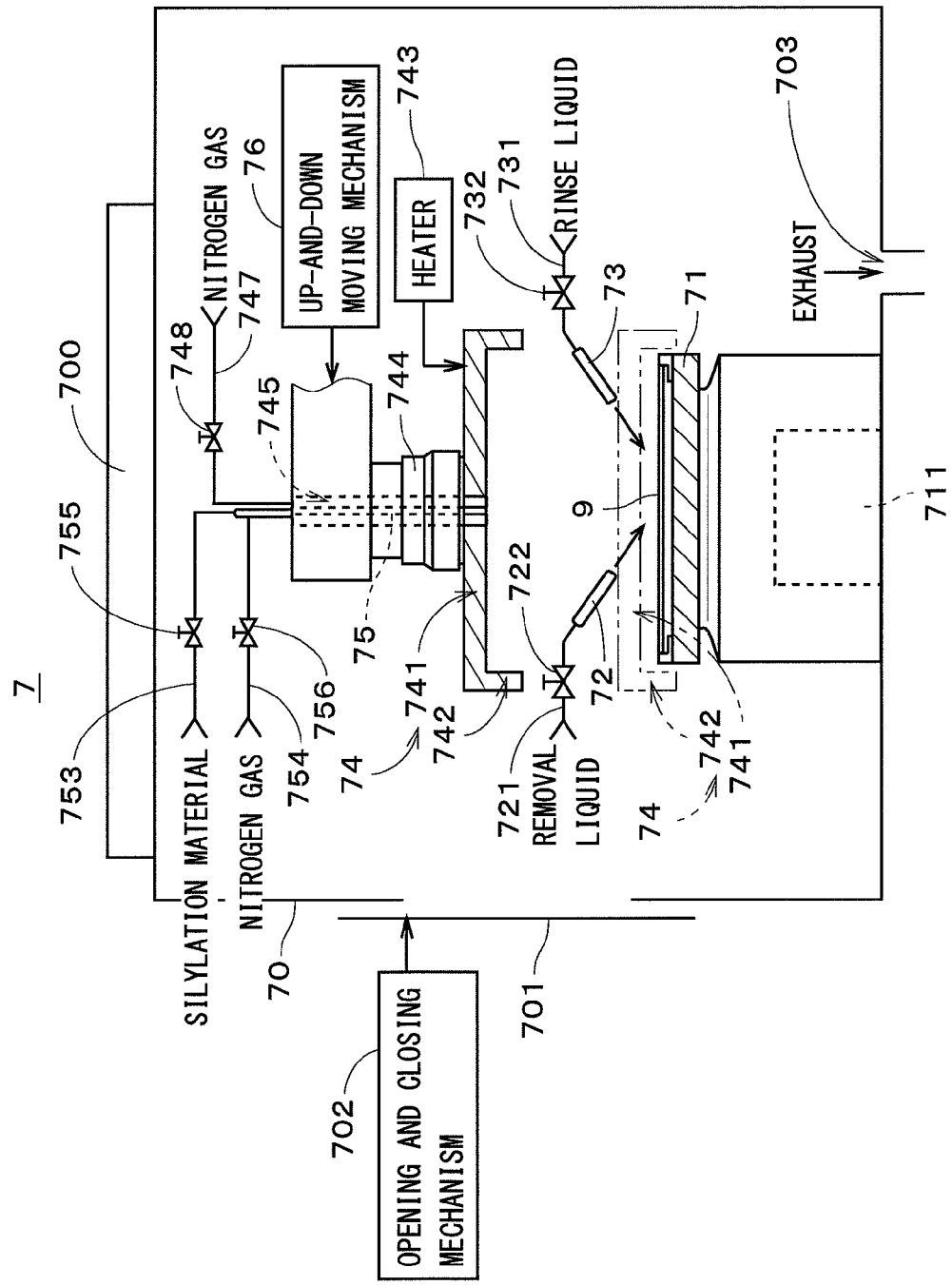
FIG. 17 is a view showing a configuration of a processing unit.

FIG. 17 is a view showing a configuration of one of the processing units 7. The processing unit 7 comprises a spin chuck 71 for holding the substrate 9, a removal liquid nozzle 72 serving as a removal liquid applying part for applying the removal liquid onto the main surface of the substrate 9, a rinse liquid nozzle 73 serving as a rinse liquid applying part for applying the rinse liquid onto the main surface of the substrate 9, and a chamber body 70 for containing the constituent elements of the processing unit 7. The spin chuck 71 is rotated by a spin motor 711 around an axis parallel to the vertical direction. The removal liquid nozzle 72 and the rinse liquid nozzle 73, like the removal liquid nozzle 43 and the rinse liquid nozzle 44 in the oxide film removing part 4 of FIG. 2, are connected to the processing liquid supplying part 5 through supply pipes 721 and 731.

The processing unit 7 further comprises a cutoff plate 74 disposed above the spin chuck 71 in the chamber body 70, a clean air supply part 700 for supplying clean air into the chamber body 70 from the upper portion of the chamber body 70, and an exhaust part (not shown) for exhausting atmosphere inside the chamber body 70 from the lower portion of the chamber body 70. The clean air supply part 700 and the exhaust part are always driven, to form an airflow from the upper to the lower in the chamber body 70.

The cutoff plate 74 comprises a horizontal disk-like part 741, a tubular part 742 protruding downward from an outer edge of the disk-like part 741, and a heater 743 connected to the disk-like part 741. A support shaft 744 is connected to the center on an upper surface of the disk-like part 741. The disk-like part 741 and the support shaft 744 are provided with a through hole penetrating vertically, which is opened at the center of a lower surface of the disk-like part 741. In the through hole, the introduction pipe 75 is inserted, not coming into contact with an inner surface of the through hole, and a lower end of the introduction pipe 75 is positioned at the opening of the through hole in the disk-like part 741.

Figure 18:
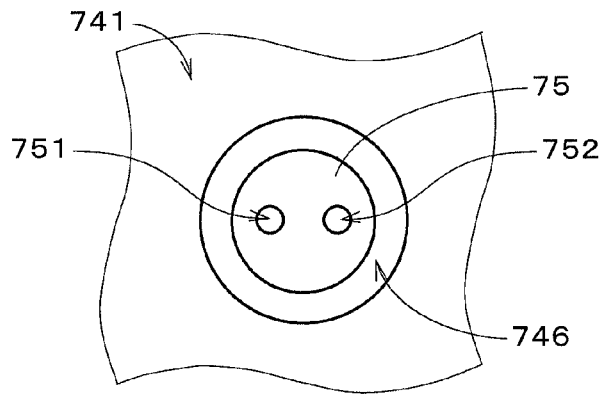
FIG. 18 is a view showing a lower end of an introduction pipe.

As shown in FIG. 18, at the lower end of the introduction pipe 75, formed are a first jet port 751 and a second jet port 752. A flow channel in the introduction pipe 75, being continuous with the first jet port 751, is connected to one end of a first supply pipe 753 shown in FIG. 17, and the other end of the first supply pipe 753 is connected to the silylation material source. In the second preferred embodiment, a vapor silylation material is used but a liquid silylation material may be used. A flow channel in the introduction pipe 75, being continuous with the second jet port 752, is connected to one end of a second supply pipe 754, and the other end of the second supply pipe 754 is connected to the nitrogen gas source. The first supply pipe 753 and the second supply pipe 754 are provided with valves 755 and 756, respectively.

Further, a tubular gas supply channel 745 is formed between the support shaft 744 (inner surface of the through hole) and the introduction pipe 75, and as shown in FIG. 18, on the lower surface of the disk-like part 741, an annular jet port 746 of the gas supply channel 745 is formed. As shown in FIG. 17, the gas supply channel 745 is connected to one end of a gas supply pipe 747 and the other end of the gas supply pipe 747 is connected to the nitrogen gas source. The gas supply pipe 747 is provided with a valve 748.

The support shaft 744 is connected to a up-and-down moving mechanism 76, and the cutoff plate 74 is moved vertically together with the support shaft 744 by the up-and-down moving mechanism 76. Specifically, the cutoff plate 74 is disposed either at a position (indicated by the two-dot chain line in FIG. 17 and hereinafter, referred to as a "close position") where the disk-like part 741 is close to the substrate 9 on the spin chuck 71 or at a position (indicated by the solid line in FIG. 17 and hereinafter, referred to as an "escape position") where the disk-like part 741 is far upward away from the spin chuck 71. In a state where the cutoff plate 74 is disposed at the close position, the lower surface of the disk-like part 741 is close to the upper surface of the substrate 9 and the cylindrical tubular part 742 surrounds the outer periphery of the substrate 9. When the cutoff plate 74 is disposed at the close position, the removal liquid nozzle 72 and the rinse liquid nozzle 73 are moved by a not-shown moving mechanism to a position where the nozzles do not interfere with the cutoff plate 74.

When the substrate processing apparatus 1a of FIG. 16 processes the substrate 9, like the substrate processing apparatus 1 of FIG. 1, a substrate 9 in a carrier 90 is taken out by the indexer robot 22 of the indexer block 2 and passed to the center robot 31 of the processing block 3. Subsequently, a shutter 701 provided in the chamber body 70 of the processing unit 7 of FIG. 17 is opened by an opening and closing mechanism 702. Then, the substrate 9 is transferred by the center robot 31 into the processing unit 7 and held by the spin chuck 71 (Step S11 in FIG. 8). At that time, the cutoff plate 74 is disposed at the escape position.

After the center robot 31 moves out of the processing unit 7, the shutter 701 is closed and the spin chuck 71 starts to be rotated by the spin motor 711. Further, by moving the removal liquid nozzle 72 to the predetermined supply position and opening a valve 722 provided in the supply pipe 721, the removal liquid nozzle 72 applies the removal liquid onto the center on the main surface of the substrate 9 (Step S12). With the rotation of the substrate 9, the removal liquid is spread outward along the main surface and applied onto the entire main surface of the substrate 9 (the same applies to the application of the rinse liquid and the application of the silylation material discussed later). After the removal liquid is continuously applied for a predetermined time period, the valve 722 is closed and the removal liquid nozzle 72 thereby stops the discharge of the removal liquid and is then returned to the predetermined waiting position.

Subsequently, by moving the rinse liquid nozzle 73 to the predetermined supply position and opening a valve 732 provided in the supply pipe 731, the rinse liquid nozzle 73 applies the rinse liquid (inert gas dissolved water) onto the main surface of the substrate 9, and the removal liquid deposited on the main surface is removed by the rinse liquid (Step S13). After the rinse liquid is continuously applied for a predetermined time period, the valve 732 is closed and the rinse liquid nozzle 73 thereby stops the discharge of the rinse liquid and is then returned to the waiting position. Further, the rotation speed of the spin chuck 71 increases and the substrate 9 is dried. After the substrate 9 is continuously dried for a predetermined time period, the rotation speed of the spin chuck 71 decreases to a predetermined rotation speed and drying of the substrate 9 is completed. Subsequently, the cutoff plate 74 is moved from the escape position to the close position. In the substrate processing apparatus 1a, the operation of Step S14 in FIG. 8 is omitted.

In the processing unit 7, by opening the valve 756 of the second supply pipe 754 and the valve 748 of the gas supply pipe 747, the nitrogen gas is jetted from the second jet port 752 and the annular jet port 746 (see FIG. 18). The atmosphere in the space surrounded by the cutoff plate 74 and the spin chuck 71 is replaced with the nitrogen gas. The gas flowing out of between the tubular part 742 and an outer edge of the spin chuck 71 is exhausted from the chamber body 70 through an exhaust outlet 703 provided in the chamber body 70.

Subsequently, by opening the valve 755 after closing the valves 756 and 748, the silylation material is jetted from the first jet port 751 (see FIG. 18). The silylation material is continuously jetted for a predetermined time period. Thus, the silylation process is performed on the main surface of the substrate 9 and the main surface is silylated (Step S15). At that time, the substrate 9 may be indirectly heated by the heater 743 connected to the disk-like part 741.

When the jetting of the silylation material is completed by closing the valve 755, the valves 756 and 748 are opened and the nitrogen gas is thereby jetted from the second jet port 752 and the annular jet port 746. The nitrogen gas is continuously jetted for a predetermined time period, and the atmosphere in the space surrounded by the cutoff plate 74 and the spin chuck 71 is replaced with the nitrogen gas.

When the jetting of the nitrogen gas is completed by closing the valves 756 and 748, the rotation of the substrate 9 is stopped and the cutoff plate 74 is moved to the escape position. After purging with the nitrogen gas, as necessary, the substrate 9 may be dried by high-speed rotation of the substrate 9. After that, the shutter 701 is opened, and the substrate 9 is taken out of the processing unit 7 by the center robot 31 of FIG. 16 and passed to the indexer robot 22 of the indexer block 2. Then, the substrate 9 is returned into the carrier 90 by the indexer robot 22 (Step S16). Further, after the application of the rinse liquid in Step S13, before drying the substrate 9, a mixed solution (SCI) of ammonia and oxygenated water may be applied onto the substrate 9 from an additionally-provided nozzle. In this case, after the application of SC1, the rinse liquid is applied again and subsequently the substrate 9 is dried.

Thus, in the processing unit 7 of the substrate processing apparatus 1a, an oxide film removing part for removing the silicon oxide film is implemented by the configuration including the removal liquid nozzle 72, the rinse liquid nozzle 73, and the processing liquid supplying part 5, a silylation part for performing the silylation process is implemented by the configuration including the cutoff plate 74 and the introduction pipe 75, and the oxide film removing part and the silylation part share the spin chuck 71 serving as a holding part for holding the substrate 9. Therefore, after the silicon oxide film on one main surface of the substrate 9 is removed, without moving the substrate 9, the silylation process is performed by applying the silylation material onto the main surface. This shortens the time from the removal of the silicon oxide film to the silylation process and suppresses the growth of the natural oxide film in a time period from the removal of the silicon oxide film to the silylation process. As a result, it is possible to lengthen the Q time until the formation of the silicon germanium film and reduce the temperature for prebaking in the formation of the silicon germanium film.

Figure 19:
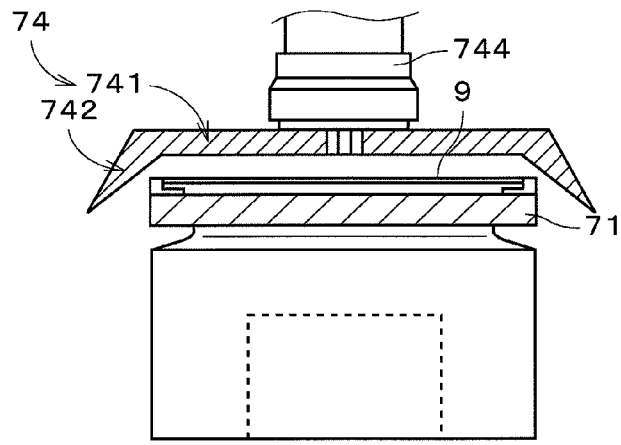
FIG. 19 is a view showing another example of a processing unit.

In the processing unit 7 of FIG. 17, though discussion has been made on the case where the tubular part 742 of the cutoff plate 74 has a cylindrical shape, the tubular part 742 may have a shape in which its diameter increases as its portion gets farther downward from the disk-like part 741, for example, as shown in FIG. 19. Further, in the tubular part 742 of FIG. 19, though the thickness thereof decreases as its portion gets farther downward from the disk-like part 741, the tubular part 742 may have a shape in which its thickness increases as its portion gets farther downward from the disk-like part 741.

Figure 20:
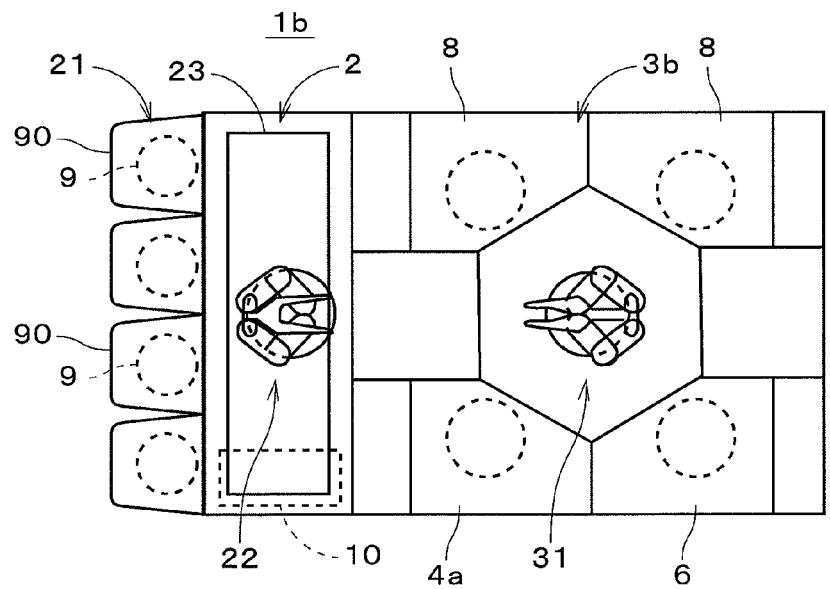
FIG. 20 is a view showing a configuration of a substrate processing apparatus in accordance with a third preferred embodiment of the present invention.

FIG. 20 is a view showing a configuration of a substrate processing apparatus 1b in accordance with the third preferred embodiment of the present invention. The substrate processing apparatus 1b of FIG. 20 is different from the substrate processing apparatus 1 of FIG. 1 in the constitution of a processing block 3b. Other constituent elements are identical to those of FIG. 1 and represented by the same reference signs. In the processing block 3b of FIG. 20, provided are two vapor treatment parts 8 and a rinse part 4a, and one silylation part 6. The rinse part 4a is the same as the oxide film removing part 4 of FIG. 2 except that the removal liquid nozzle 43 is omitted, and in the rinse part 4a, only the process with the rinse liquid from the rinse liquid nozzle 44 is performed. The silylation part 6 is the same as the silylation part 6 of FIG. 5.

Figure 21:
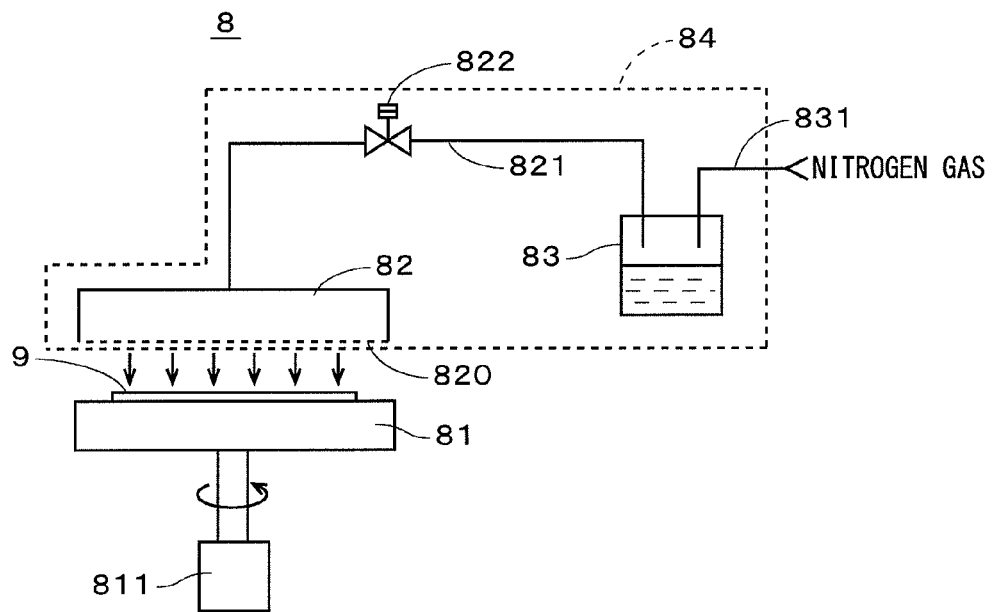
FIG. 21 is a view showing a configuration of a vapor treatment part.

FIG. 21 is a view showing a configuration of the vapor treatment part 8. The vapor treatment part 8 comprises a hot plate 81 having a heater inside, and the substrate 9 is held on an upper surface of the hot plate 81 by vacuum adsorption. The hot plate 81 is rotated by a motor 811 around an axis parallel to the vertical direction. Above the hot plate 81, provided is a vapor jet part 82. The vapor jet part 82 jets a vapor of hydrofluoric acid discussed later toward the substrate 9 placed on the hot plate 81 through a diffusion plate 820.

The vapor jet part 82 is connected to one end of a supply pipe 821 and the other end of the supply pipe 821 is connected to a hydrofluoric acid tank 83 in which hydrofluoric acid (other removal liquids may be used) is stored. The supply pipe 821 is provided with a valve 822. The hydrofluoric acid is supplied into the hydrofluoric acid tank 83 as appropriate from a now-shown hydrofluoric acid source, and in the hydrofluoric acid tank 83, a predetermined amount of hydrofluoric acid is thereby always stored. The hydrofluoric acid tank 83 is provided with a supply pipe 831 connected to a not-shown nitrogen gas source and the nitrogen gas is supplied into the hydrofluoric acid tank 83 from the nitrogen gas source through the supply pipe 831. Then, by opening the valve 822 of the supply pipe 821, a vapor of hydrofluoric acid together with the nitrogen gas is supplied into the vapor jet part 82 through the supply pipe 821.

In a gas supply part 84 including the constitution surrounded by the broken line in FIG. 21, the temperature is controlled to a predetermined temperature by a not-shown temperature controller and a not-shown heating part. The temperature of the vapor of the hydrofluoric acid which is supplied from the vapor jet part 82 onto the main surface of the substrate 9 is maintained to a predetermined temperature. In the vapor treatment part 8 of FIG. 21, the temperature of the substrate 9 is controlled to 12 to 120° C., preferably 30 to 100° C. In an actual case, the vapor jet part 82, the hot plate 81, and motor 811 are contained in a not-shown chamber body.

In the processing of the substrate 9 by the substrate processing apparatus 1b of FIG. 20, the substrate 9 is transferred to the chamber body of the vapor treatment part 8 and placed on the hot plate 81 of FIG. 21 (Step S11 of FIG. 8). Subsequently, the nitrogen gas is supplied from a nozzle provided in the chamber body while the chamber body is decompressed, the atmosphere in the chamber body is replaced with the nitrogen gas.

When the inside of the chamber body is filled with the nitrogen gas, the substrate 9 is rotated at a predetermined rotation speed (e.g., 10 to 300 rpm, and herein 150 rpm). By opening the valve 822, the vapor of the hydrofluoric acid is jetted at a predetermined flow rate (e.g., 5 to 100 liters per minute, and herein 30 liters per minute) from the vapor jet part 82 toward the substrate 9. The vapor of the hydrofluoric acid is continuously jetted for a predetermined time period, and the silicon oxide film on the substrate 9 is thereby removed (Step S12). After that, by closing the valve 822, the jetting of the vapor of the hydrofluoric acid from the vapor jet part 82 is stopped. Then, the nitrogen gas is supplied into the chamber body, and the atmosphere in the chamber body is thereby replaced with the nitrogen gas.

Subsequently, the substrate 9 is taken out of the vapor treatment part 8 and transferred to the rinse part 4a. Then, like in the first preferred embodiment, the rinse liquid is applied onto the substrate 9 from the rinse liquid nozzle 44 (see FIG. 2), to thereby perform a rinse process (Step S13). After the rinse process is completed, the substrate 9 is transferred to the silylation part 6 (Step S14) and the silylation process is performed on the main surface of the substrate 9 (Step S15). After the silylation process is completed, the substrate 9 is taken out of the silylation part 6 and returned into the carrier 90 (Step S16).

Thus, in the substrate processing apparatus 1b, the silicon oxide film on one main surface of the substrate 9 is removed by the vapor of the hydrofluoric acid in the vapor treatment part 8 serving as the oxide film removing part, and then the silylation material is applied onto the main surface, to thereby perform the silylation process in the silylation part 6. It is thereby possible to lengthen the Q time until the formation of the silicon germanium film and reduce the temperature for prebaking in the formation of the silicon germanium film.

Figure 22:
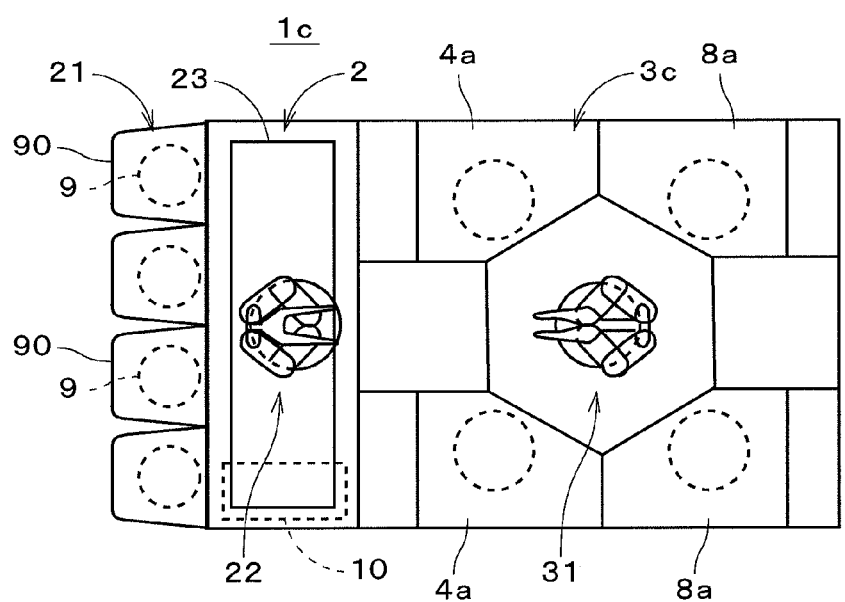
FIG. 22 is a view showing a configuration of a substrate processing apparatus in accordance with a fourth preferred embodiment of the present invention.

FIG. 22 is a view showing a configuration of a substrate processing apparatus 1c in accordance with the fourth preferred embodiment of the present invention. The substrate processing apparatus 1c of FIG. 22 is different from the substrate processing apparatus 1 of FIG. 1 in the constitution of a processing block 3c. Other constituent elements are identical to those of FIG. 1 and represented by the same reference signs. In the processing block 3c of FIG. 22, provided are two vapor treatment parts 8a and two rinse parts 4a.

Figure 23:
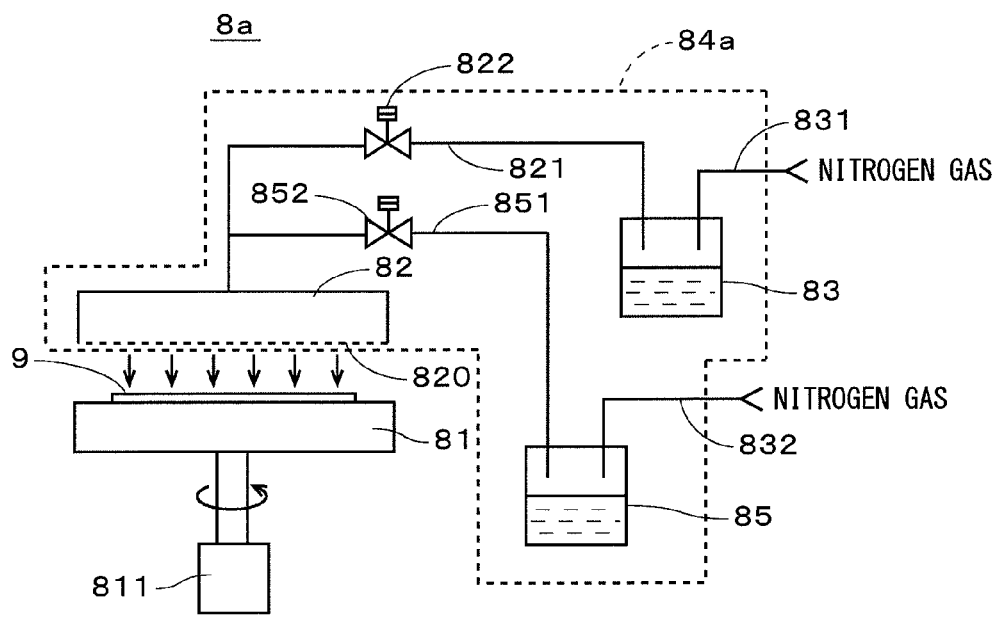
FIG. 23 is a view showing a configuration of another vapor treatment part.

FIG. 23 is a view showing a configuration of the vapor treatment part 8a. The vapor treatment part 8a is different from the vapor treatment part 8 of FIG. 21 in the constitution of a gas supply part 84a. Other constituent elements are identical to those of FIG. 21 and represented by the same reference signs.

In the gas supply part 84a, one end of another supply pipe 851 is connected to a portion in the supply pipe 821, between the vapor jet part 82 and the valve 822, and the other end of the supply pipe 851 is connected to a silylation material tank 85 in which a liquid of the silylation material is stored. The supply pipe 851 is provided with a valve 852. The silylation material is supplied into the silylation material tank 85 as appropriate from a now-shown silylation material source, and in the silylation material tank 85, a predetermined amount of silylation material is thereby always stored. The silylation material tank 85 is provided with a supply pipe 832 connected to the not-shown nitrogen gas source and the nitrogen gas is supplied into the silylation material tank 85 from the nitrogen gas source through the supply pipe 832. Then, by opening the valve 852 of the supply pipe 851, a vapor of silylation material together with the nitrogen gas is supplied into the vapor jet part 82 through the supply pipe 851 and part of the supply pipe 821.

In the processing of the substrate 9 by the substrate processing apparatus 1c of FIG. 22, the substrate 9 is transferred to the chamber body of the vapor treatment part 8a and placed on the hot plate 81 of FIG. 23 (Step S11 of FIG. 8). Before the substrate 9 is transferred into the vapor treatment part 8a, prerinse may be performed on the substrate 9 in the rinse part 4a as needed. Subsequently, the nitrogen gas is supplied from a nozzle provided in the chamber body while the chamber body is decompressed, the atmosphere in the chamber body is replaced with the nitrogen gas.

When the inside of the chamber body is filled with the nitrogen gas, like in the third preferred embodiment, the substrate 9 is rotated at a predetermined rotation speed and the vapor of the hydrofluoric acid is jetted from the vapor jet part 82 toward the substrate 9. The vapor of the hydrofluoric acid is continuously jetted for a predetermined time period in the vapor treatment part 8a, and the silicon oxide film on the substrate 9 is thereby removed (Step S12). After the jetting of the vapor of the hydrofluoric acid is stopped, the nitrogen gas is supplied into the chamber body, and the atmosphere in the chamber body is thereby replaced with the nitrogen gas.

Subsequently, by opening the valve 852, the vapor of the silylation material (containing the nitrogen gas) is jetted at a predetermined flow rate (e.g., 5 to 100 liters per minute, and herein 30 liters per minute) from the vapor jet part 82 toward the substrate 9. The silylation process is thereby performed on the main surface of the substrate 9 (Step S15). After the vapor of the silylation material is continuously jetted for a predetermined time period, by closing the valve 852, the jetting of the vapor of the silylation material is stopped. Then, the nitrogen gas is supplied into the chamber body, and the atmosphere in the chamber body is thereby replaced with the nitrogen gas. After that, the substrate 9 is taken out of the vapor treatment part 8a and returned into the carrier 90 (Step S16). In the substrate processing apparatus 1c, the operations of Steps S13 and S14 in FIG. 8 are omitted. Further, between Step S12 and Step S15, the process of replacing the atmosphere in the chamber body with the nitrogen gas may be omitted.

Thus, in the vapor treatment part 8a of the substrate processing apparatus 1c, an oxide film removing part for removing the silicon oxide film is implemented by the configuration including the hydrofluoric acid tank 83, a silylation part for performing the silylation process is implemented by the configuration including the silylation material tank 85, and the oxide film removing part and the silylation part share the hot plate 81 serving as a holding part for holding the substrate 9. Therefore, after the silicon oxide film on one main surface of the substrate 9 is removed in the vapor jet part 82a, without moving the substrate 9, the silylation process is performed by applying the silylation material onto the main surface. This shortens the time from the removal of the silicon oxide film to the silylation process and suppresses the growth of the natural oxide film in a time period from the removal of the silicon oxide film to the silylation process. As a result, it is possible to lengthen the Q time until the formation of the silicon germanium film and reduce the temperature for prebaking in the formation of the silicon germanium film.

Further, in the vapor treatment part 8a, since the vapor jet part 82 for jetting a vapor toward the substrate 9 is shared by the oxide film removing part and the silylation part, it is possible to reduce the number of parts in the substrate processing apparatus 1c.

Figure 24:
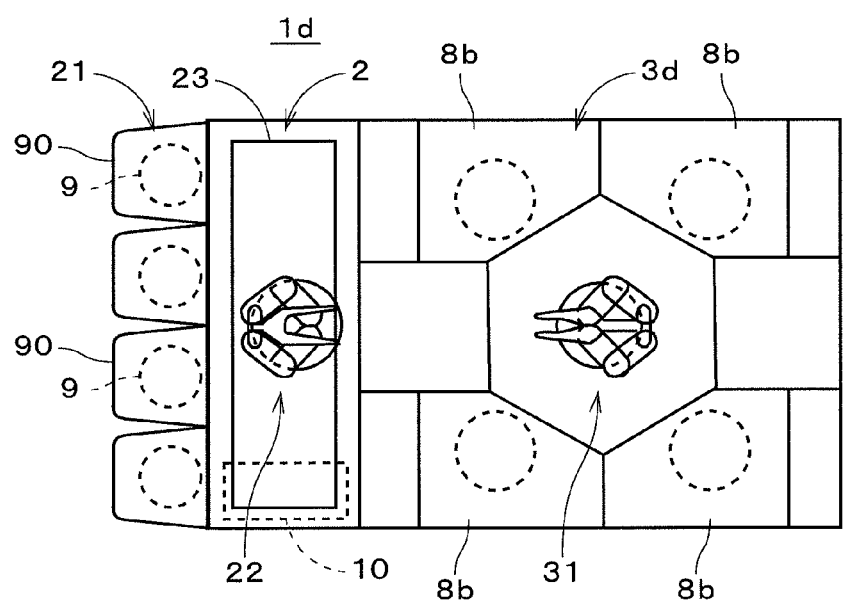
FIG. 24 is a view showing a configuration of a substrate processing apparatus in accordance with a fifth preferred embodiment of the present invention.

FIG. 24 is a view showing a configuration of a substrate processing apparatus 1d in accordance with the fifth preferred embodiment of the present invention. The substrate processing apparatus 1d of FIG. 24 is different from the substrate processing apparatus 1 of FIG. 1 in the constitution of a processing block 3d. Other constituent elements are identical to those of FIG. 1 and represented by the same reference signs. In the processing block 3d of FIG. 24, provided are four vapor treatment parts 8b. The vapor treatment part 8b has a constitution in which the rinse liquid nozzle used for the rinse process is additionally provided in the vapor treatment part 8a of FIG. 23 and can perform the rinse process. In the substrate processing apparatus 1d of FIG. 24, with this constitution, the removal of the silicon oxide film with the vapor of the hydrofluoric acid, the rinse process using the rinse liquid, and the silylation process with the vapor of the silylation material can be consecutively performed without moving the substrate 9.

Though the preferred embodiments of the present invention have been discussed above, the present invention is not limited to the above-discussed preferred embodiments, but allows various variations.

In the above-discussed first and second preferred embodiments, though the oxygen concentrations in both the removal liquid and the rinse liquid are reduced by the processing liquid supplying part 5, the oxygen concentration in either of the removal liquid and the rinse liquid may be reduced. In the processing liquid supplying part 5, by reducing the oxygen concentration in either of the removal liquid and the rinse liquid, in cooperation with the silylation process after the removal of the silicon oxide film, it is thereby possible to further lengthen the Q time until the formation of the silicon germanium film and further reduce the temperature for prebaking in the formation of the silicon germanium film.

In the above-discussed first and third preferred embodiments, though it is possible to prevent the surface of the substrate 9 from being contaminated since the center robot 31 transfers the substrate 9 after the removal of the silicon oxide film is completed from the oxide film removing part to the silylation part 6, a substrate moving mechanism for moving the substrate 9 from the oxide film removing part to the silylation part 6 may be implemented by a mechanism other than the center robot 31.

In the substrate processing apparatuses 1 and 1a to 1d, the arrangement of the constituent elements (the oxide film removing part 4, the silylation parts 6 and 6a, the processing unit 7, and the vapor treatment parts 8, 8a, and 8b) in the processing blocks 3 and 3a to 3d may be changed as appropriate, and for example, a plurality of constituent elements may be stacked in the vertical direction.

The above technique for lengthening the Q time until the formation of the silicon germanium film and reducing the temperature for prebaking, by performing the silylation process after removal of the silicon oxide film, may be adopted in a batch-type substrate processing apparatus for collectively processing a plurality of substrates. Further, the substrate 9 to be processed by the substrate processing apparatuses 1 and 1a to 1d may be one on which a pattern other than the pattern for transistors is formed.

The configurations in the above-discussed preferred embodiments and variations may be combined as appropriate only if those do not conflicted with one another.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2011-187415 filed in the Japan Patent Office on Aug. 30, 2011, the entire disclosure of which is incorporated herein by reference.

Reference Signs List 1, 1a to 1d substrate processing apparatus
4 oxide film removing part
5 processing liquid supplying part
6, 6a silylation part
7 processing unit
8, 8a, 8b vapor treatment part
9 substrate
31 center robot
43, 72 removal liquid nozzle
44, 73 rinse liquid nozzle
71 spin chuck
81 hot plate
S12, S13, S15 step

The invention claimed is:

1. A substrate processing method for processing a silicon substrate, comprising the steps of:
   a) removing a silicon oxide film from a main surface of a silicon substrate;
   b) applying a silylation material to said main surface to thereby perform a silylation process thereon so that the silylated main surface is in a state where growth of a natural oxide film is suppressed, and
   c) performing a process for forming a silicon germanium film, on said main surface, wherein
   said step b) is performed without moving said silicon substrate after said step a),
   said step a) comprises the steps of
   a1) applying a removal liquid used for removing said silicon oxide film, onto said main surface; and
   a2) applying a rinse liquid onto said main surface,
   wherein oxygen concentration in at least one of said removal liquid and said rinse liquid which includes dissolved inert gas, is reduced to 20 ppb or less.

2. The substrate processing method according to claim 1, wherein a pattern for transistors is formed on said silicon substrate.

3. The substrate processing method according to claim 1, wherein
   said step c) includes formation of silicon germanium film on said main surface by prebaking and a thermal CVD method.

4. The substrate processing method according to claim 1, wherein
   said silylation process in said step b) causes a state where silyl groups due to said silylation material are present over said main surface from which said silicon oxide film is removed.

5. The substrate processing method according to claim 1, wherein
   a time period from completion of said step a) to start of said step c) is set to forty-eight hours.

6. A substrate processing method for processing a silicon substrate, comprising the steps of:
   a) removing a silicon oxide film from a main surface of a silicon substrate;
   b) applying a silylation material to said main surface to thereby perform a silylation process thereon, and
   c) performing a process for forming a silicon germanium film, on said main surface, wherein
   said step a) is performed in an oxide film removing part, said step b) is performed in a silylation part, and said silicon substrate is moved from said oxide film removing part to said silylation part between said steps a) and b),
   said step a) comprises the steps of
   a1) applying a removal liquid used for removing said silicon oxide film, onto said main surface; and
   a2) applying a rinse liquid onto said main surface,
   wherein oxygen concentration in at least one of said removal liquid and said rinse liquid which includes dissolved inert gas, is reduced to 20 ppb or less.

7. The substrate processing method according to claim 6, wherein a pattern for transistors is formed on said silicon substrate.

8. The substrate processing method according to claim 6, wherein
   said step c) includes formation of silicon germanium film on said main surface by prebaking and thermal CVD method.

9. The substrate processing method according to claim 6, wherein
   said silylation process in said step b) causes a state where silyl groups due to said silylation material are present over said main surface from which said silicon oxide film is removed.

10. The substrate processing method according to claim 6, wherein
   a time period from completion of said step a) to start of said step c) is set to forty-eight hours.

* * * * *